US009257908B2

United States Patent
Thompson et al.

(10) Patent No.: US 9,257,908 B2
(45) Date of Patent: Feb. 9, 2016

(54) SYSTEMS AND METHODS TO AUTO-ADJUST ZERO CROSS CIRCUITS FOR SWITCHING REGULATORS

(71) Applicant: Maxim Integrated Products, Inc., San Jose, CA (US)

(72) Inventors: Matthew Dale Thompson, Chandler, AZ (US); Hongguang Dong, Chandler, AZ (US); Cory Arnold, Chandler, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 99 days.

(21) Appl. No.: 13/874,923

(22) Filed: May 1, 2013

(65) Prior Publication Data

US 2014/0300329 A1 Oct. 9, 2014

Related U.S. Application Data (60) Provisional application No. 61/790,809, filed on Mar. 15, 2013.

(51) Int. Cl.
*H02M 3/158* (2006.01)
*H03K 5/1536* (2006.01)
*H02M 3/156* (2006.01)
*H02M 1/00* (2007.01)

(52) U.S. Cl.
CPC .......... *H02M 3/1588* (2013.01); *H02M 3/156* (2013.01); *H03K 5/1536* (2013.01); *H02M 2001/0009* (2013.01); *H02M 2001/0054* (2013.01)

(58) Field of Classification Search
CPC ................. H05K 5/1536; H02M 2001/0009; H02M 2001/0054; H02M 2001/0058; H02M 3/156; H02M 3/1588
See application file for complete search history.

(56) References Cited

U.S. PATENT DOCUMENTS

| 6,643,145 | B1 * | 11/2003 | Harrison | 363/16 |
|---|---|---|---|---|
| 7,652,945 | B2 | 1/2010 | Chu et al. | |
| 2008/0191677 | A1 * | 8/2008 | Bacchi et al. | 323/282 |
| 2008/0211473 | A1 * | 9/2008 | Tlasksl et al. | 323/283 |
| 2008/0246455 | A1 * | 10/2008 | Chu et al. | 323/283 |
| 2008/0298106 | A1 * | 12/2008 | Tateishi | 363/127 |
| 2010/0194370 | A1 * | 8/2010 | Cheng | 323/285 |
| 2010/0321041 | A1 * | 12/2010 | Feldtkeller | 324/680 |
| 2011/0148377 | A1 * | 6/2011 | Schiff et al. | 323/283 |
| 2011/0309815 | A1 * | 12/2011 | Yu et al. | 323/311 |
| 2012/0176104 | A1 * | 7/2012 | Chen et al. | 323/235 |
| 2012/0176108 | A1 * | 7/2012 | Goto | 323/271 |
| 2012/0235653 | A1 * | 9/2012 | Chen et al. | 323/271 |

* cited by examiner

*Primary Examiner* — Fred E Finch, III
(74) *Attorney, Agent, or Firm* — North Weber & Baugh LLP (57) ABSTRACT

Various embodiments of the present invention provide for an adaptive and accurate zero cross circuit that can operate without directly sensing an inductor current. Certain embodiments allow adjustment of a zero crossing condition while eliminating the need for a blanking time. In certain embodiments this is accomplished by detecting the effects of turning off a switch on a switching node voltage of a buck converter. Some embodiments use a counter to lengthen or shorten the delay time between an inductor crossing a zero value and the effect of the switching event. In one embodiment, the effect of the switching event includes a change in the direction of the switching node voltage from which the direction of a current flowing in the buck converter inductor.

19 Claims, 8 Drawing Sheets

SYSTEMS AND METHODS TO AUTO-ADJUST ZERO CROSS CIRCUITS FOR SWITCHING REGULATORS

CROSS REFERENCE TO RELATED PATENT APPLICATIONS

The present application claims priority to U.S. Provisional Application Ser. No. 61/790,809 titled "Systems and Methods to Auto-Adjust Zero Cross Circuits for Switching Regulators," filed on Mar. 15, 2013 by Matthew Dale Thompson, Hongguang Dong, and Cory Arnold, which application is incorporated herein by reference in its entirety.

BACKGROUND

A. Technical Field

The present invention relates to switching regulators, and more particularly, to systems, devices, and methods of detecting and adjusting zero cross in switching regulators.

B. Background of the Invention

Switching regulator design for mobile device applications trends toward reducing component size and developing regulators that perform at higher and higher switching frequencies that allow designers to reduce the area that a circuit occupies on a board, especially by shrinking the size of inductors.

Switching regulator designers have been seeking solutions that allow to reduction in the size of external components as well as embed, for example, the LC filter in the same package as the control circuitry without compromising efficiency. Buck switching regulators, in particular, provide improved efficiency for relatively light load currents when operated in discontinuous conduction mode. Discontinuous conduction mode operation, however, typically requires the implementation of some type of current sensing circuitry to detect and ideally prevent a reverse current from flowing from the output of the filter through the inductor back into the synchronous rectifier and to ground. The task of designing an appropriate current sense circuit that accurately monitors the reverse inductor current becomes increasingly more difficult as switching frequencies continue to increase.

Existing methods to sense and minimize reverse current involve complex and, hence, costly circuitry. One conventional method uses a sense resistor in series with the output inductor. One method uses an RC network that mimics the time constant of the inductor and its parasitic resistance to detect when the current through the inductor reaches zero. Other methods use the on-resistance, $R_{DS\_ON}$, of the power FET within the switching regulator to measure the voltage across the power FET in order to derive an inductor current therefrom.

While using $R_{DS\_ON}$ as a sense resistor allows elimination of another resistive component that would further degrade efficiency, this approach suffers from propagation delays and requires a blanking time while waiting for the switching node voltage at the output inductor to settle after turning on the power FET of the synchronous rectifier before the voltage across the power FET can be sensed. Propagation delay makes this method of preventing reverse current flow through the inductor back into the regulator in response to detecting a zero crossing impractical at frequencies higher than about 6 MHz. What is needed are tools for switching regulator designers to overcome the above-described limitations.

SUMMARY OF THE INVENTION

Various embodiments of the present invention provide for an adaptive and accurate zero cross adjusting circuit that can operate under a range of load and environmental conditions. At high switching frequencies, in particular, certain embodiments present a simple and effective way to adjust a zero crossing condition while eliminating the need for a blanking time.

In some embodiments the zero crossing condition is automatically adjusted by detecting the effects of a switching event, such as the turning off of a switch, on a switching node voltage of a buck converter and adjusting a switching event in a following cycle via a counter by appropriately lengthening or shortening a delay between the effects of the switching event on the switching node voltage and the actual zero crossing. The effects of the switching event include a change in direction of the switching node voltage from which the direction of a current flowing in a buck converter inductor is determined.

In certain embodiments, a delay module receives a first control signal from a current sense circuit that indirectly senses current by detecting when a node voltage signal exceeds a predetermined threshold voltage. In response, the delay module generates a second control signal for the buck converter to control the switching of the buck converter in a manner so as to minimize the time delay between the first control signal and the actual switching event.

Certain features and advantages of the present invention have been generally described here; however, additional features, advantages, and embodiments presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention.

In this document, "positive inductor current" refers to current flow directed from the inductor towards an output voltage or a load. Conversely, a "negative inductor current" refers to current flow directed from the output voltage or load back into the inductor towards the regulator. "Regulator," "switching regulator," and "buck converter" are used interchangeably herein, as are "delay module" and "zero crossing delay module." Although this document makes reference to buck converters, the invention is not limited to thereto, as various embodiments of the invention can equally be applied to other switching regulators and power supplies recognized by one of skilled in the art.

Figure 1:
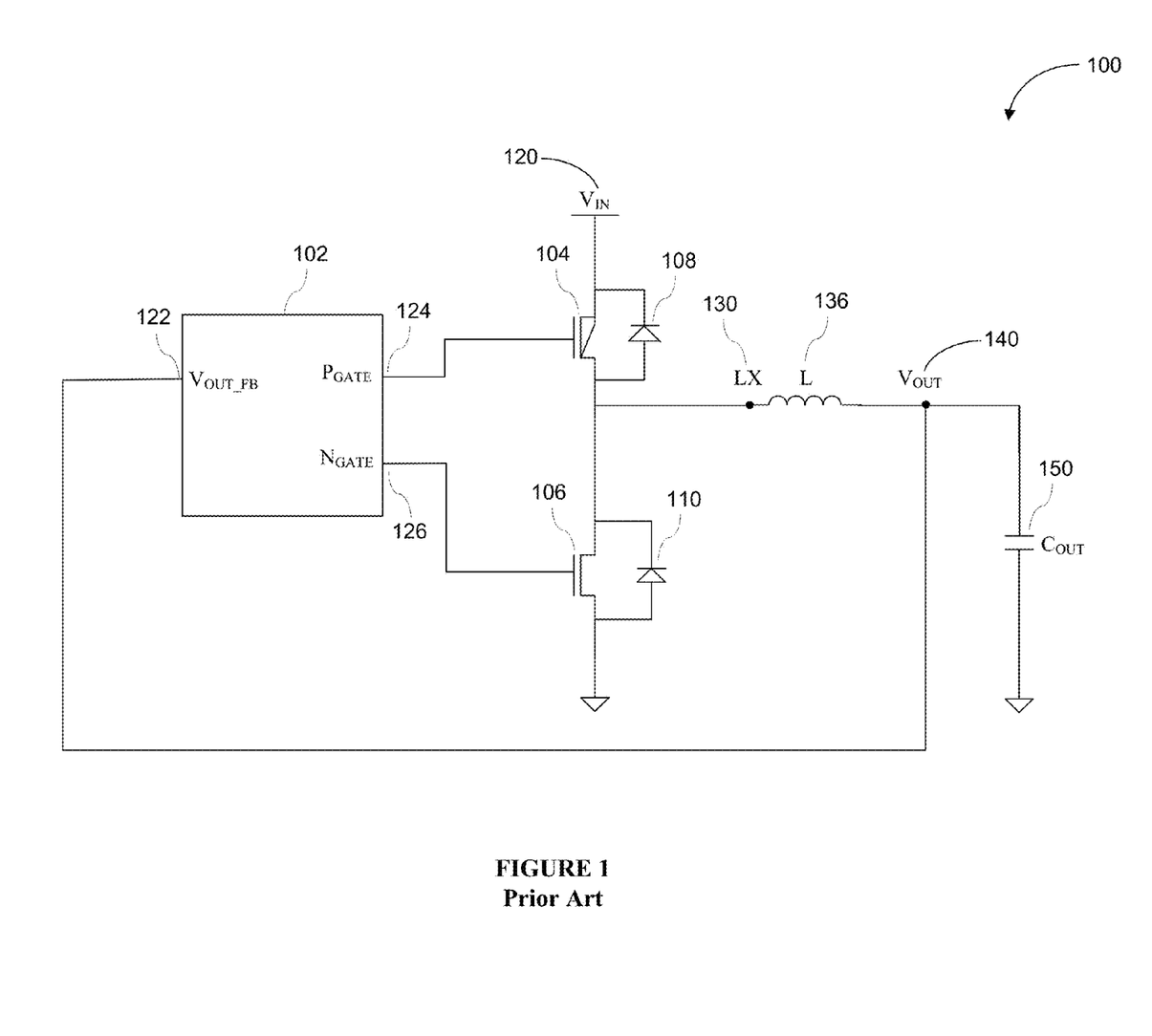
FIG. 1 is a schematic of a prior art switching regulator circuit design.

FIG. 1 is a schematic of a prior art switching regulator circuit design. Regulator 100 comprises duty cycle controller 102, PMOS transistor 104, and NMOS transistor 106. Each transistor 104, 106 is connected parallel to a respective back body diode 108 and 110, for example, a Schottky diode that protects against current bursts caused by the switching of an inductive load (not shown). The polarity of diodes 108, 110 is chosen such that the anode of PMOS back body diode 108 is connected to the source of PMOS transistor 104, while its cathode is connected to the drain of PMOS transistor 104. Conversely, the anode of NMOS back body diode 110 is connected to the drain of NMOS transistor 106, while its cathode is connected to the source of NMOS transistor 106. Input voltage Vin 120, which is provided for example by a Li-ion battery having a nominal output voltage value of 3.7 V, is applied to the source of PMOS transistor 104, while the source of NMOS transistor 106 is connected to ground.

As shown in FIG. 1, duty cycle controller 102 is implemented in a feedback configuration so as to receive at its input 122 output voltage $V_{OUT}$ 140 and output gate driving signals $P_{GATE}$ 124 and $N_{GATE}$ 126, which control the gates of transistor 104 and 106. The drains of both transistors 104, 106 are connected each other and to switching voltage node LX 130. Node LX 130 is connected to a first terminal of inductor L 136. The other terminal is connected to output voltage node 140, which is AC coupled to ground via output capacitor 150. In addition, a "zero cross" circuit (not shown) prevents current from flowing back from node $V_{OUT}$ 140 through inductor L 136. Output voltage $V_{OUT}$ 140 is used to drive an external device, such as a microcontroller or a sensor (not shown) that has a voltage requirement (e.g., 1.2 V) that is lower than the input voltage 120.

In detail, duty cycle controller 102 monitors and adjusts $V_{OUT}$ 140 to the desired voltage value by controlling the duty cycle of buck regulator 100 via gate drive signals $P_{GATE}$ 124 and $N_{GATE}$ 126. When $P_{GATE}$ drive signal 124 transitions from a high state to a low state (e.g., from $V_{IN}$ to 0V), PMOS transistor 104 turns on, and when $P_{GATE}$ drive signal 124 transitions to a high state, PMOS 104 turns off. Conversely, when $N_{GATE}$ drive signal 126 transitions to a high state, NMOS 106 turns on; and when $N_{GATE}$ drive signal 126 transitions to a low state, NMOS 106 turns off. The repeated switching drives a current through inductor L 136 and the load. Transistors 104 and 106 are alternately turned on to generate a square wave shaped voltage signal at switching node LX 130. The square wave voltage $V_{LX}$ generated at switching node 130 may have an amplitude equal to input voltage $V_{IN}$ 120 and a constant switching frequency. Duty cycle controller 102 adjusts $V_{OUT}$ 140 independently of $V_{IN}$ 120 or any DC load current by adjusting the ratio of on-time to off-time of transistors 104 and 106 for a given switching frequency. Voltage $V_{LX}$ at node LX 130 is filtered by inductor 136 and output capacitor 150 that form an LC filter to obtain a DC voltage output $V_{OUT}$ 140. The inductance value of filter inductor L 136 and capacitance value $C_{OUT}$ of filter capacitor 150 are chosen to limit the ripple on $V_{OUT}$ 140 to an acceptable range that is determined by the requirements of the load and the feedback of buck regulator 100.

During operation, in continuous conduction mode (CCM), i.e., when the current flowing through inductor 136 is either ramping up or ramping down, most of the time either PMOS transistor 104 or NMOS transistor 106 is turned on. But it is undesirable to have both transistors turned on at the same time during the switching process since allowing both transistors to conduct current would short the power source directly to ground and result in current bursts, known as shoot-through currents, that greatly deteriorate circuit efficiency. The efficiency of circuit 100 can be defined as:

$$P_{OUT}/P_{IN}=(I_L*V_{OUT})/(V_{IN}*I_{IN}),$$

wherein $I_L$ is the inductor current, $I_{IN}$ is the input current delivered by the power source, and $P_{OUT}$ is the power delivered to the load. Additionally, current bursts may damage circuit components (e.g, transistors). In CCM, there are instances when both PMOS transistor 104 and NMOS transistor 106 are turned off simultaneously during each switching transition creating a "dead time" between transitions, i.e., in order to prevent shoot-through current. In order to ensure that there is no time instance in which the power source is shorted to ground during the transition, one transistor should be turned off for a sufficient length of time, e.g., for 1-3 ns, before turning on the other. This scheme associated with creating dead time intervals to prevent shoot-through current is known as "break before make." Diode 108, 110 carries any current flowing through inductor L 136 during this short interval.

In contrast, in discontinuous conduction mode (DCM), NMOS transistor 106 is turned off for a certain period of time before PMOS transistor 104 is turned on and vice versa, during which time the current through inductor 136 ideally reaches 0 A. Especially for low load currents, output capacitor 150 is discharged only relatively slowly and switching operations are discontinued until the feedback loop requests the next pulse, such that the pulses of PMOS transistor 104 are spread out over a longer period of time. As a result, the reduced switching losses in power transistor 104, 106 significantly increase the efficiency in this mode of operation. However, at light load conditions, current through inductor 136 tends to fall below 0 A, for example, each time the ripple current turns negative. The resulting reverse current through inductor 136 is typically detected by a zero crossing circuit and controlled by a feedback controller, not shown in FIG. 1, in order to prevent current flowing back into NMOS transistor 106 and conduction and switching losses associated therewith.

Figure 2:
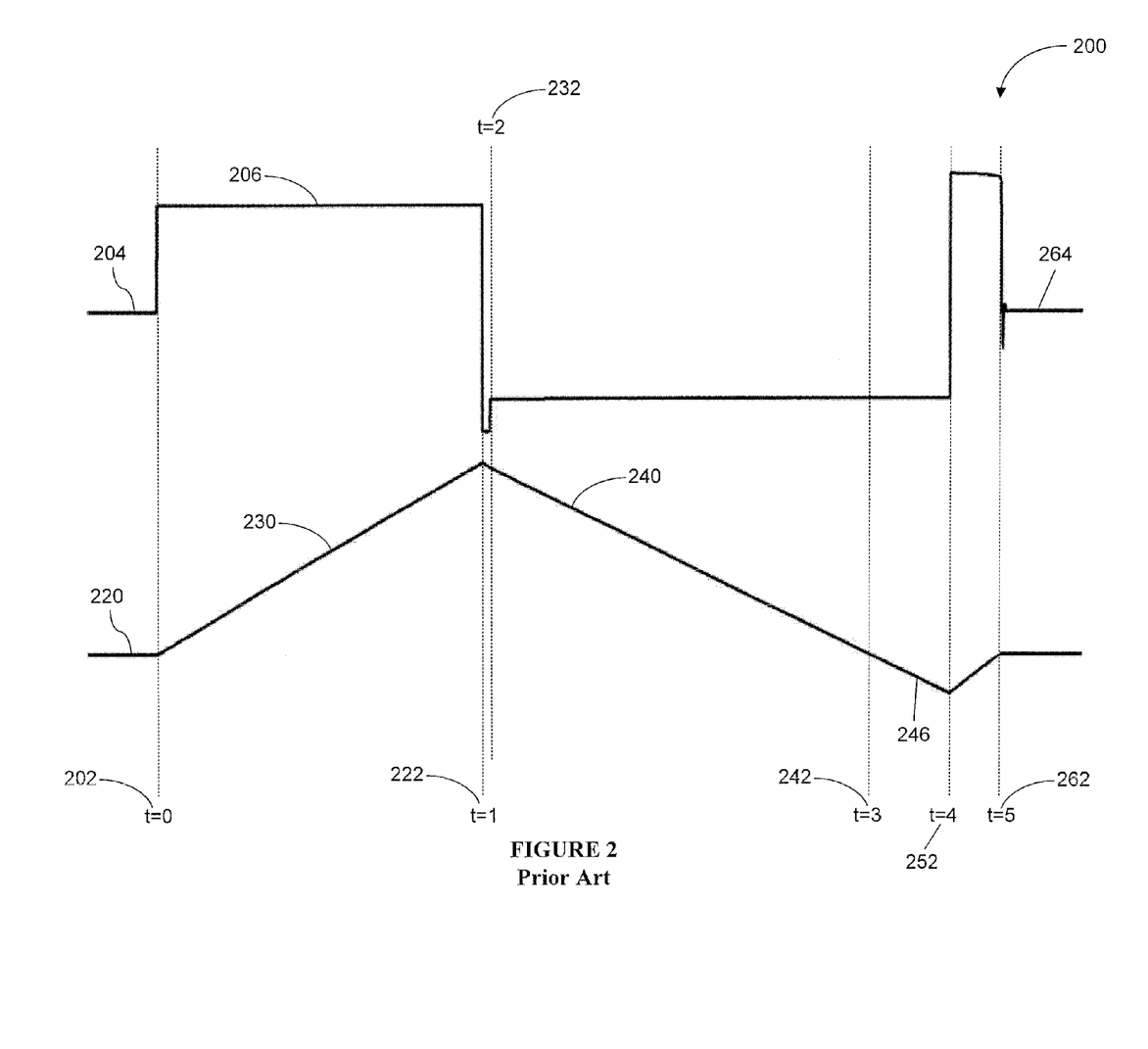
FIG. 2 is an illustration of the behavior of the switching node voltage and corresponding inductor current in FIG. 1 for a scenario in which the NMOS transistor turns off too late in discontinuous conduction mode.

FIG. 2 is a general illustration of the behavior of the switching node voltage and corresponding inductor current in FIG. 1 for a scenario in which the NMOS transistor turns off too late in DCM. Assuming that at time t=$t_0$ 202 both NMOS transistor and PMOS transistor are initially turned off, when the feedback controller turns on the PMOS transistor, input voltage $V_{IN}$ 206 is applied to the inductor and, thus, to voltage at node LX 204. The resulting voltage drop across the inductor causes the output voltage node $V_{OUT}$ to assume a value equal to $V_{IN}-V_L$. Since the output capacitor $C_{OUT}$ conducts virtually no DC current, the voltage $V_L$ across inductor is held at a fairly constant DC value giving rise to inductor current $I_L$ 220 that exhibits a constant rising slope 230. When at time t=$t_1$ 222 feedback controller turns off the PMOS transistor and turns on the NMOS transistor after a short dead time, the NMOS transistor is turned on at time t=$t_2$ 232. Inductor current $I_L$ 220 begins to fall with constant slope 240 forming the triangular wave shape of inductor current $I_L$ 220 shown in FIG. 2. This triangular "ripple current" is presented to the output capacitor $C_{OUT}$ shown in FIG. 1, which delivers a DC load current to the load.

Ideally, feedback controller turns off the NMOS transistor at time t=$t_3$ 242, exactly when $I_L$ 220 crosses the 0 A threshold. However, if feedback controller turns off the NMOS transistor late (at time t=$t_4$ 252), inductor current $I_L$ 220 will overshoot the zero crossing before the NMOS transistor is turned off and reverse direction to become negative until, at time t=$t_4$ 252, the NMOS transistor is turned off. The negative current will initially flow to ground via the NMOS transistor of the synchronous rectifier, as the inductor acts like an additional current source that continues to deliver current after the NMOS transistor is turned off. Once the NMOS transistor is actually turned off at time t=$t_4$ 252, this causes node voltage $V_{LX}$ 204 to rise from 0 V to above the supply voltage $V_{IN}$ 206 (e.g., 3.5 V) by an amount equivalent to the voltage drop across the PMOS back body diode (e.g., 0.7 V) to reach a peak value (e.g., 4.2 V). The negative inductor current 246 will continue to flow through the PMOS body diode (e.g., into the source resistance of the battery) and node voltage $V_{LX}$ (204 will remain at its peak value during the time that negative inductor current 246 decreases until, at time t=$t_5$ 262, no more current flows through the inductor, as the inductor is practically shorted. At this time node voltage $V_{LX}$ 220 drops to the desired output voltage $V_{OUT}$ 264.

Figure 3:
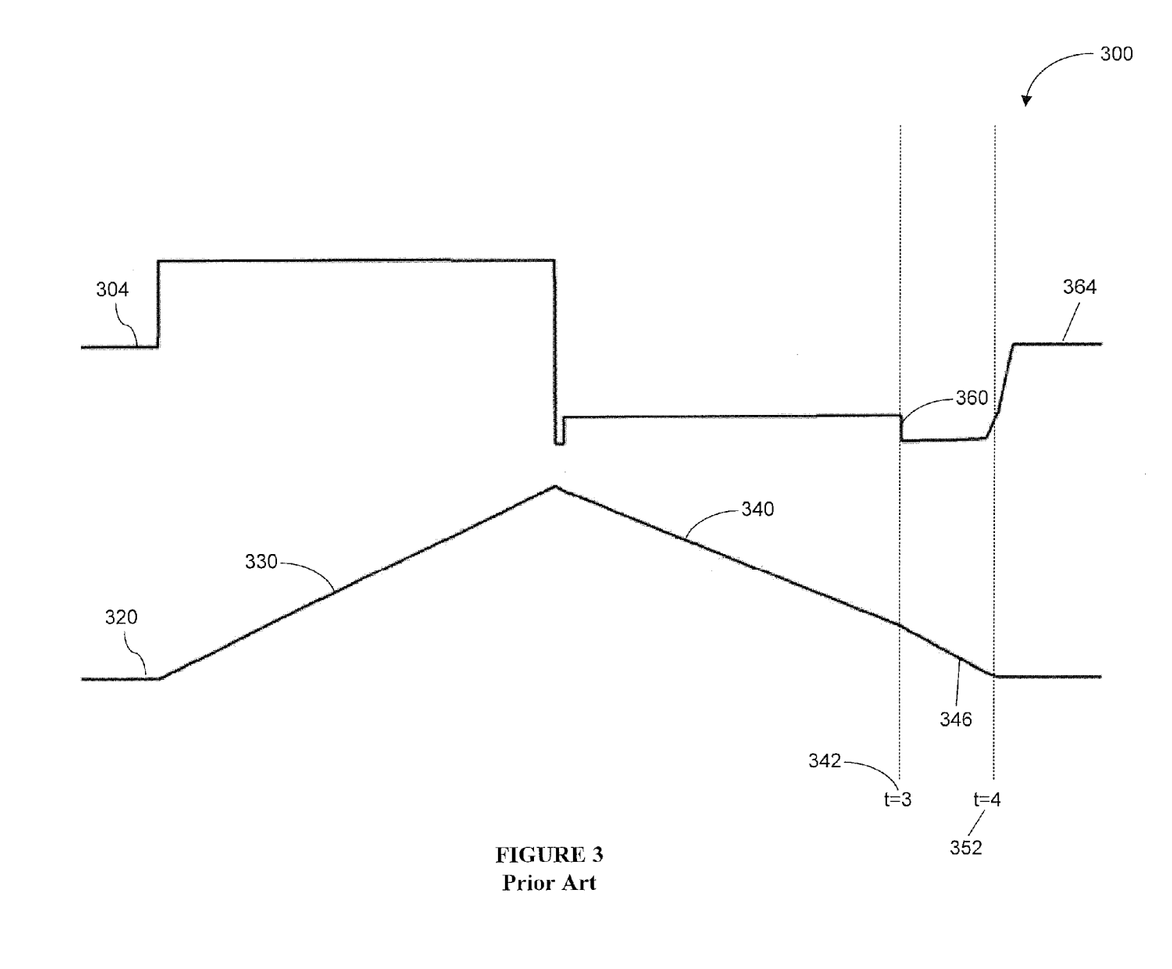
FIG. 3 is an illustration of the behavior of the switching node voltage and corresponding inductor current in FIG. 1 for a scenario in which the NMOS transistor turns off too early in discontinuous conduction mode.

FIG. 3 shows the behavior of the switching node voltage and corresponding inductor current in FIG. 1 for a scenario in which the NMOS transistor turns off too early in discontinuous conduction mode. In contrast to FIG. 2, in FIG. 3 the zero cross circuit turns off the NMOS transistor before inductor current 320 has reached its zero value, such that inductor current 346 will still be positive at time t=$t_3$ 342. When both NMOS and PMOS transistor are turned off at the same time, according to Lenz's law, the inductor will resist the change in current flow and force the current to continue to flow in another path. If node voltage $V_{LX}$ 304 tries to go below ground potential (0 V), it will be caught by the NMOS back body diode and drop one NMOS body diode voltage 360 below ground, as shown in FIG. 3. The positive current will continue to flow through the NMOS back body diode into inductor 346 and the load. Node voltage $V_{LX}$ 304 will remain below ground while the positive current in the inductor decreases toward zero, at which time node voltage $V_{LX}$ 304 rises to output voltage $V_{OUT}$ 364, as the inductor is again practically shorted.

Figure 4:
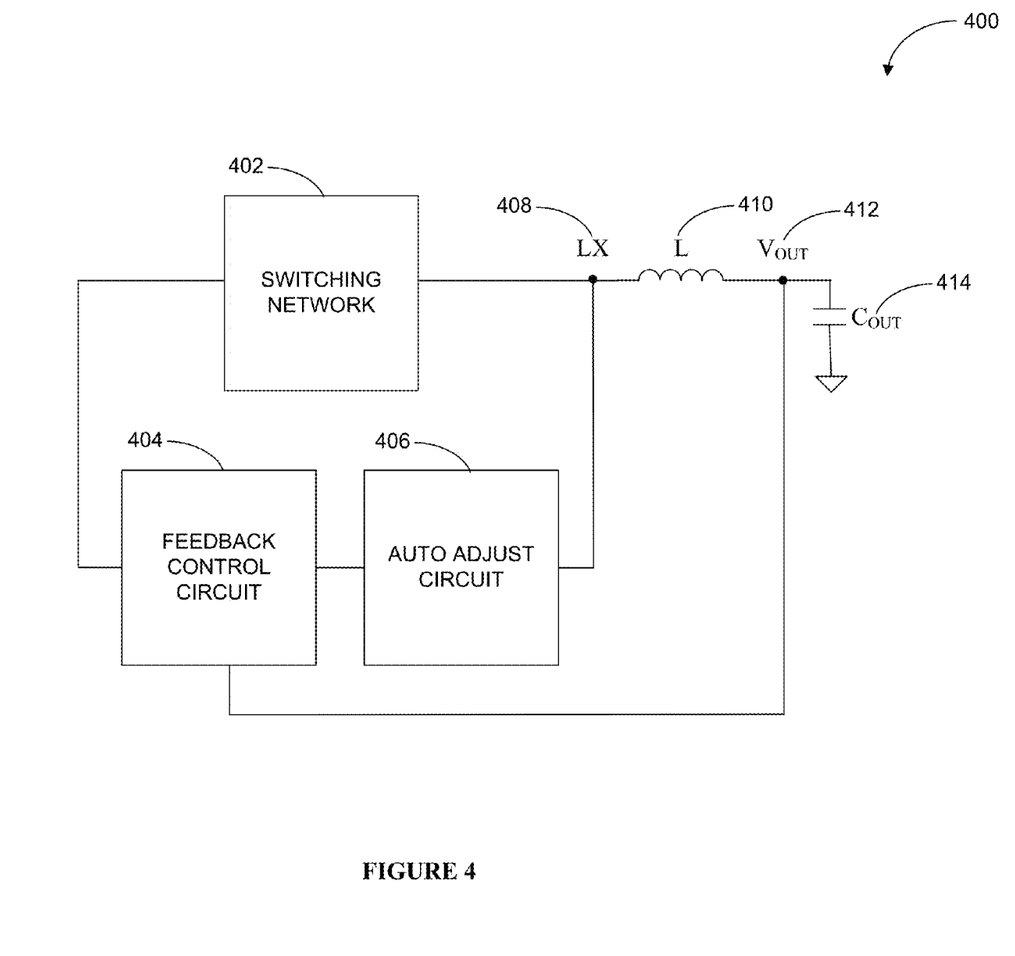
FIG. 4 is a general block diagram of a switching regulator system comprising an auto-adjust zero cross circuit according to various embodiments of the invention.

FIG. 4 is a general block diagram of a switching regulator system comprising an auto-adjust zero cross circuit according to various embodiments of the invention. Switching regulator system 400 comprises switching network 402, feedback control circuit 404, auto-adjust circuit 406, inductor 410, and output capacitor 414. Switching network 402 comprises elements of a switching regulator, such as a buck converter, a boost converter, or any combination thereof. It is noted that inductor 410 and output capacitor 414 may be electrical components that are internal or external to switching network 402.

Feedback control circuit 404 is coupled to receive a control signal from auto-adjust circuit 406 and output voltage $V_{OUT}$ 412. Feedback control circuit 404 comprises control logic that controls switching network 402 in response to both signals. Output voltage $V_{OUT}$ 534 is used to drive an external device (not shown) that has a voltage requirement that is lower than input voltage 504. Auto-adjust circuit 406 comprises circuitry to sense a current or voltage at node LX 408.

In operation, switching regulator system 400, takes advantage of different conditions that exist when the current flowing through inductor 410 is above or below a threshold value, in this example 0 A. Sensing circuitry within auto-adjust circuit 406 senses whether a voltage at node LX 408 increases or decreases in response to a trigger event within switching network 402. The trigger event within switching network 402 is typically associated with a switching event. In one embodiment, the event is the turning off of a semiconductor MOSFET device, such as an n-channel or p-channel type MOSFET. In addition, auto-adjust circuit prevents current from flowing back from node $V_{OUT}$ 412 through inductor L 410.

Figure 5:
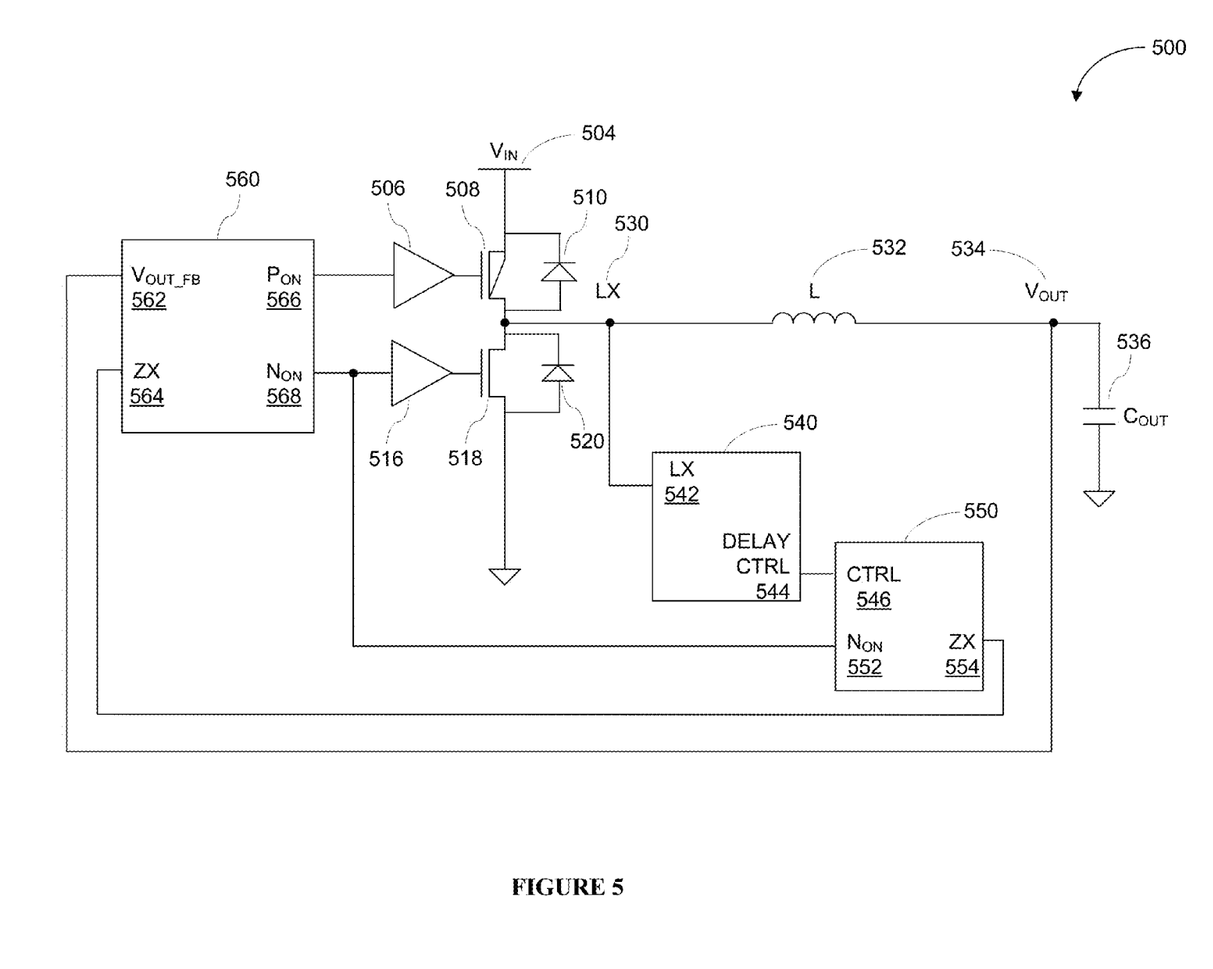
FIG. 5 is a schematic of a switching regulator comprising an auto-adjust zero cross circuit according to various embodiments of the invention.

FIG. 5 is a schematic of a switching regulator comprising an auto-adjust zero cross circuit according to various embodiments of the invention. Switching regulator 500 comprises control logic 560, gate buffer 506, 516, PMOS transistor 508, NMOS transistor 518, sense circuit 540, zero cross delay module 550, inductor 532, and output capacitor 536. Both PMOS transistor 508 and NMOS transistor 518 further comprise back body diode 510 and 520.

Control logic 560 comprises input terminals 562, 564 to receive output voltage signal 534 and respective control signal 554 that are coupled to form two distinct feedback loops. Signals generated at output terminals 566, 568 of control logic 560 control gate buffers 506 and 516, via gate driving signals $P_{ON}$ 566 and $N_{ON}$ 568, respectively. In this example, gate buffer 506 drives PMOS transistor 508, while gate buffer 516 drives NMOS transistor 518. The drains of PMOS transistor 508 and NMOS transistor 518 are coupled to switching voltage node LX 530, which is coupled to a first terminal of inductor L 532. Inductor L 532 is an internal or external inductor with one terminal coupled to output voltage node 534.

Sense circuit 540 is coupled to receive voltage node LX 530 and comprises sensing circuitry, for example a comparator, to process the information delivered at input terminal 542. At output terminal 544, sense circuit 540 outputs a delay control signal that is passed to input terminal 546 of zero cross delay module 550. At a second input terminal 552, delay module 550 receives gate driving signal $N_{ON}$ 568. In one embodiment, delay module 550 is a calibration circuit that comprises an up-down counter. Output terminal 554 of zero cross delay module 550 is coupled to input terminal 564 of control logic 560 in a feedback configuration.

In operation, sense circuit 540 observes node voltage 530 to detect a variation in node voltage 530 caused by a turn-off event of NMOS transistor 518. In the simplest implementation, the sensing circuitry of sense circuit 540 comprises a comparator circuit that is configured to detect the variation in node voltage 530 by comparing it to one or more known reference potentials. For example, after NMOS transistor 518 turns off, the drains of PMOS transistor 508 and NMOS transistor 518 may be compared with two converters, one at +200 mV and one at −200 mV. Depending on which of the converters win the race to a latch, a determination can be made about the direction of node voltage 530. In continuous conduction mode, sense circuit 540 may perform sensing operations when switching regulator 500 operates in a dead time when both transistors 508, 518 are turned off before PMOS transistor 510 is turned on.

In one embodiment, a detected direction in node voltage 530 indicates the direction that node voltage 530 assumes following the turn-off event. This direction is also representative of the direction of an inductor current flowing through inductor 532. From the direction information, sense circuit 540 determines a type of delay, for example, whether NMOS transistor 518 was turned off before or after the current through inductor 532 crossed a predetermined value (e.g., 0 A). It is noted that any other threshold value, such as an offset voltage, may be used. The threshold value may be set or programmed and adjusted by an appropriate calibration procedure.

In one embodiment, a decrease in node voltage 530 following the turn-off event of NMOS transistor 518 indicates that NMOS transistor 518 was turned off before the current through inductor 532 crossed 0 A, i.e., too early. This also indicates that the current through inductor 532 is positive.

In contrast, an increase in node voltage 530 indicates that NMOS transistor 518 was turned off after the current through inductor 532 crossed 0 A, i.e., too late, indicating that the current through inductor 532 is negative. However, any mismatch in the timing of the zero crossing causes current flow through inductor L 532 accompanied by a voltage drop across voltage node 530 and back body diode 510, 520 resulting in a back diode current that causes unnecessary power loss. Therefore, it is desirable to avoid any premature or belated transistor turn-off conditions.

Upon determining the type of delay, sense circuit 540 outputs a control signal to zero cross delay module 550. In one embodiment, upon determining that NMOS transistor 518 was turned off too early, delay module 550 lengthens the delay time in the following cycle by a predetermined amount in order to adjust the turn-off time of NMOS closer to the actual zero crossing of the inductor current to avoid a reverse inductor current situation. Conversely, if node voltage 530 increases, indicating that NMOS transistor was turned off too late, then the delay time is shortened by a predetermined amount to adjust for it. In one embodiment, delay module 554 is disabled each time PMOS transistor 508 is turned on, for example, by blanking out control signal 554.

In one embodiment, delay module 550 accomplishes calibration by employing an up-down counter to adjust the delay time in response to sense circuit 540 detecting a variation in node voltage 530. The calibration process is continued until the circuit finds the setting that is closest to the ideal zero cross current threshold. At steady state, the counter will dither back and forth between the least significant bit around that threshold, whereby the time step of the LSB programmable delay (e.g., 1 ns) and the slope of the inductor current determines the accuracy of the zero crossing.

One of ordinary skill in the art will appreciate that, based on the principles described above, using the turn-off signal of the NMOS transistor is just one example of a trigger event. Any suitable signal representative of the effect of premature or belated transistor turn-off or inductor current reversal can be used as a trigger signal. One alternative is to use the turn-on signal of the NMOS transistor, which can be viewed as a delayed version of the turn-off signal. It is envisioned that the principle of monitoring whether node voltage 530 rises or falls after NMOS transistor 520 turns off may also be applied to auto-trim or automatically calibrate other current sense zero-cross circuits, including "senseless current sense" and sense resistor type architectures.

One alternative way of gauging whether the inductor current is positive or negative when the NMOS turns off is to measure whether node voltage 530 rises before or after the PMOS gate transitions in to a low state. It is noted that if the adjustment by delay module 550 occurs in the cycle following the detection by sense circuit 540, rather than in the instant of detection, propagation delays in sense circuit 540 itself are not critical to the operation of switching regulator 500.

In one embodiment, zero detection accuracy is improved by using a sensor in a manner so as to obtain a more accurate representation of the valley current through inductor 532. In this example, increased accuracy is achieved by determining how far node voltage 530 deviates from a predetermined value by measuring the voltage drop across or a proportional current through back body diode 510, 520 (or a part thereof), which advantageously exhibits a relatively constant and predictable change over temperature. The potential downside of reduced speed in this approach, is outweighed in one embodiment, by implementing the change in a subsequent cycle.

In one embodiment, rather than adjusting the time delay of the zero cross signal, quasi square wave switching is achieved in switching regulator 500 by adjusting the switching frequency at node 530. As the switching frequency at node 530 effects the ripple current, this frequency can be decreased to a level that will ensure that the inductor current crosses a predetermined threshold value (e.g., 0 A) irrespective of the actual load current. In this example, when PMOS transistor 508 is turned off, the current through inductor 136 will be positive and will lower the voltage at node 530. NMOS transistor 518 is turned on ideally when the voltage at node 530 is exactly 0 V.

Conversely, when the NMOS transistor 518 is turned off, the switching frequency at node 530 has been modified, such that the current through inductor 316 is slightly negative, which will increase the voltage at node 530. PMOS transistor 508 is turned on ideally when voltage at node 530 exactly equals input voltage $V_{IN}$ 504. As a result, switching losses are reduced and efficiency is improved.

Figure 6:
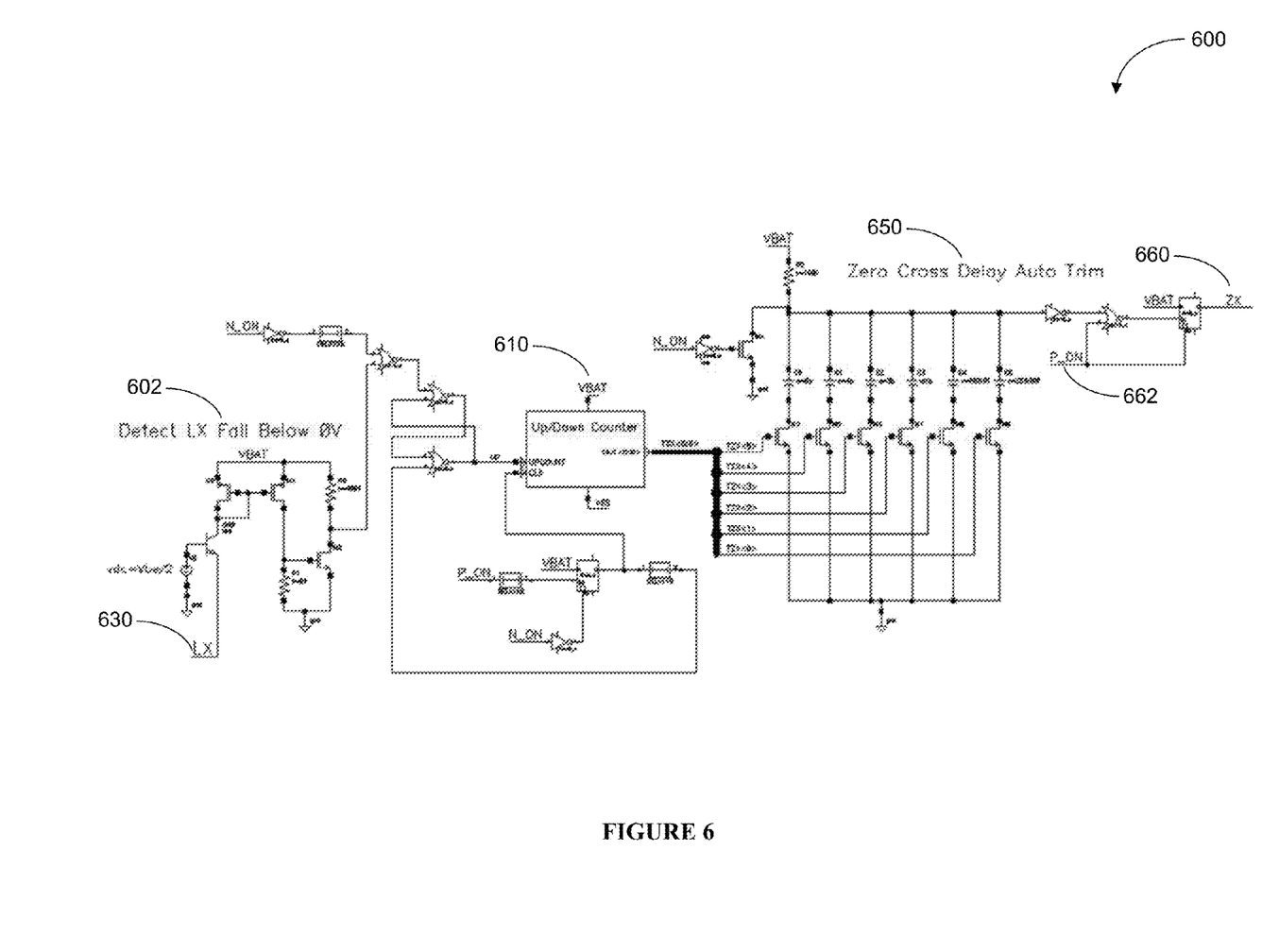
FIG. 6 is a schematic of a possible implementation of an auto-adjust zero cross circuit according to various embodiments of the invention.

FIG. 6 is a schematic of a possible implementation of an auto-adjust zero cross circuit according to various embodiments of the invention. Auto-adjust zero cross circuit 600 comprises zero crossing delay module 650, sensor 602, and counter 610. In this example, counter 610 is implemented as a 6 bit up/down counter that programs the zero cross delay up and down.

In one embodiment, sensor 602 detects whether node voltage 630 drops below a predetermined threshold value after NMOS transistor turns off. In this example, once sensor 602 detects that node voltage 630 falls below ground potential 644 by a value equal to about one half of the base-emitter voltage required to turn on transistor 608, a positive inductor current is assumed to flow from node voltage 630 to an output voltage. In response, counter 610 programs zero crossing delay module 650 to adjust zero cross signal 660 in a manner so as to increase the zero cross time delay in order to adjust the zero crossing accordingly.

In one embodiment, if node voltage 630 does not fall below the predetermined threshold value, sensor 602 is not activated. Rather, it is assumed that node voltage 630 increased, i.e., inductor current 664 is assumed to have a negative value, such that counter 610 programs zero crossing delay module 650 to adjust zero cross signal 660 to decrease the zero cross time delay. In this example, in instances in which inductor current 664 remains constant (e.g., 0 A) sensor 602 is not employed, and auto-adjust zero cross circuit 600 will assume a positive current in the inductor when the NMOS transistor is turned off and will behave as if node voltage 630 increased.

In one embodiment, by observing node voltage 630, sensor 602 detects whether switching regulator should operate in CCM or DCM. In CCM, the load current is high enough such that the inductor current does not fall below 0 A. Sensor 602 detects that node voltage 630 turns negative during a dead time. In this case, counter 610 counts out to a maximum delay time, for example, three times the switching frequency of the regular operation in CCM. The feedback loop, via Vout, controls NMOS to turn off and PMOS to turn on before the zero cross delay time expires, such that signal ZX remains without effect. In one embodiment, signal ZX is blanked out with $P_{ON}$ signal, so that signal ZX is prevented from assuming a high state.

When the load current becomes sufficiently low, such that that the inductor current crosses zero, auto-adjust zero cross circuit 600 enters DCM to improve efficiency. Since the inductor current is negative when the NMOS turns off, node voltage 630 increases during the dead time and counter 610 begins counting to program zero crossing delay module 650 in a manner so as to cause zero cross signal 660 to decrease the zero cross time delay.

Eventually zero crossing delay module 650 will count in so far that ZX signal 660 precedes $P_{ON}$ signal 662 such that the NMOS will be turned off by ZX signal 660 instead of $P_{ON}$ signal 662. ZX signal 660 will turn off the NMOS before $P_{ON}$ signal 662 signals to PMOS to turn on. Both PMOS and NMOS will stay off until the feedback loop signals via $P_{ON}$ signal 662 that Vout is too low, which causes PMOS to turn on again. Zero crossing delay module 650 will adjust such that it will turn off the NMOS with ZX signal 660 when the inductor current is slightly above 0 A.

Figure 7:
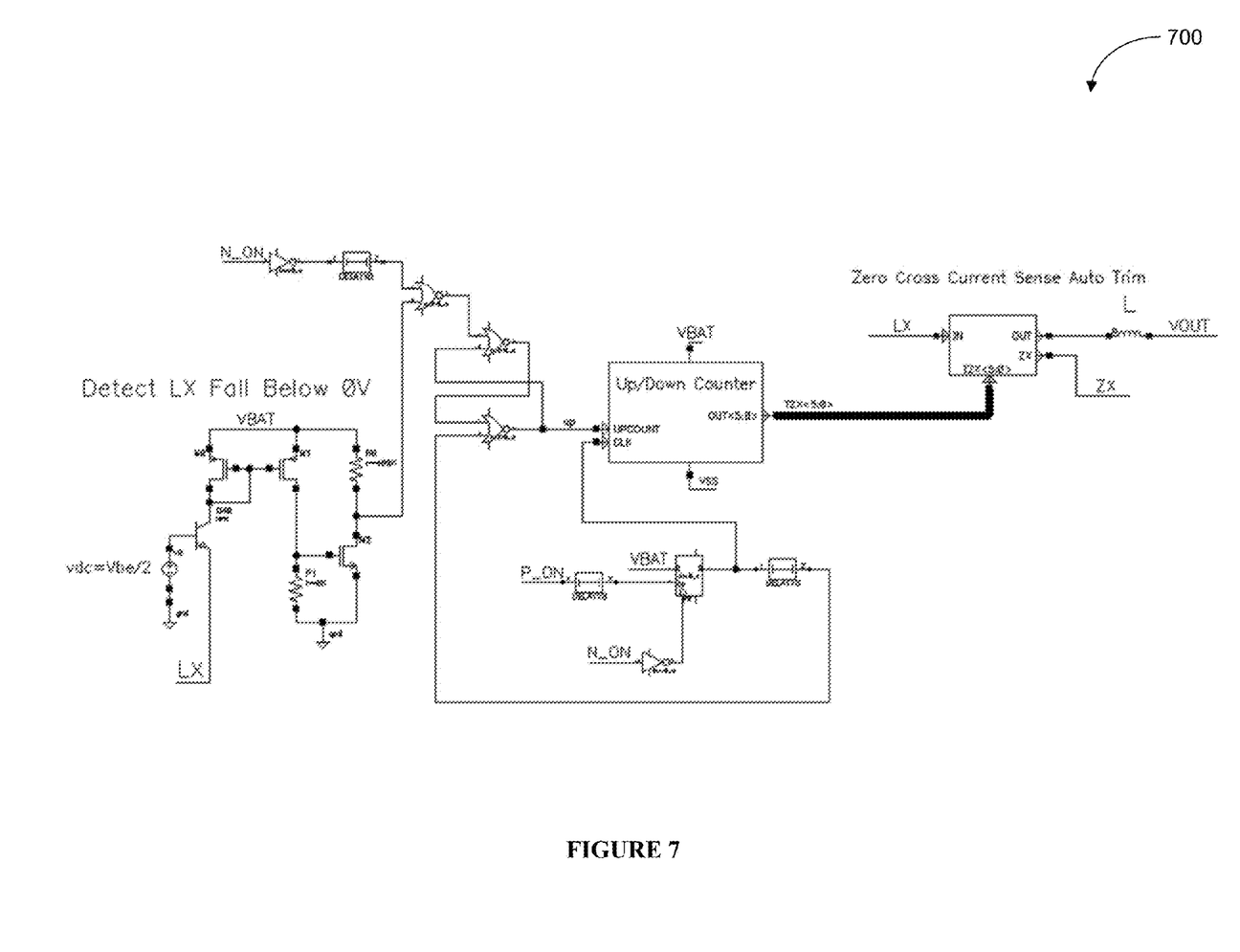
FIG. 7 is a schematic of another possible implementation of an auto-adjust zero cross circuit according to various embodiments of the invention.

FIG. 7 is a schematic of another possible implementation of an auto-adjust zero cross circuit according to various embodiments of the invention. FIG. 7 demonstrates that the bits of the up/down counter in FIG. 6 may be used to adjust any type of zero cross current sense circuit by auto adjusting an offset or a propagation delay of a current sense comparator.

Figure 8:
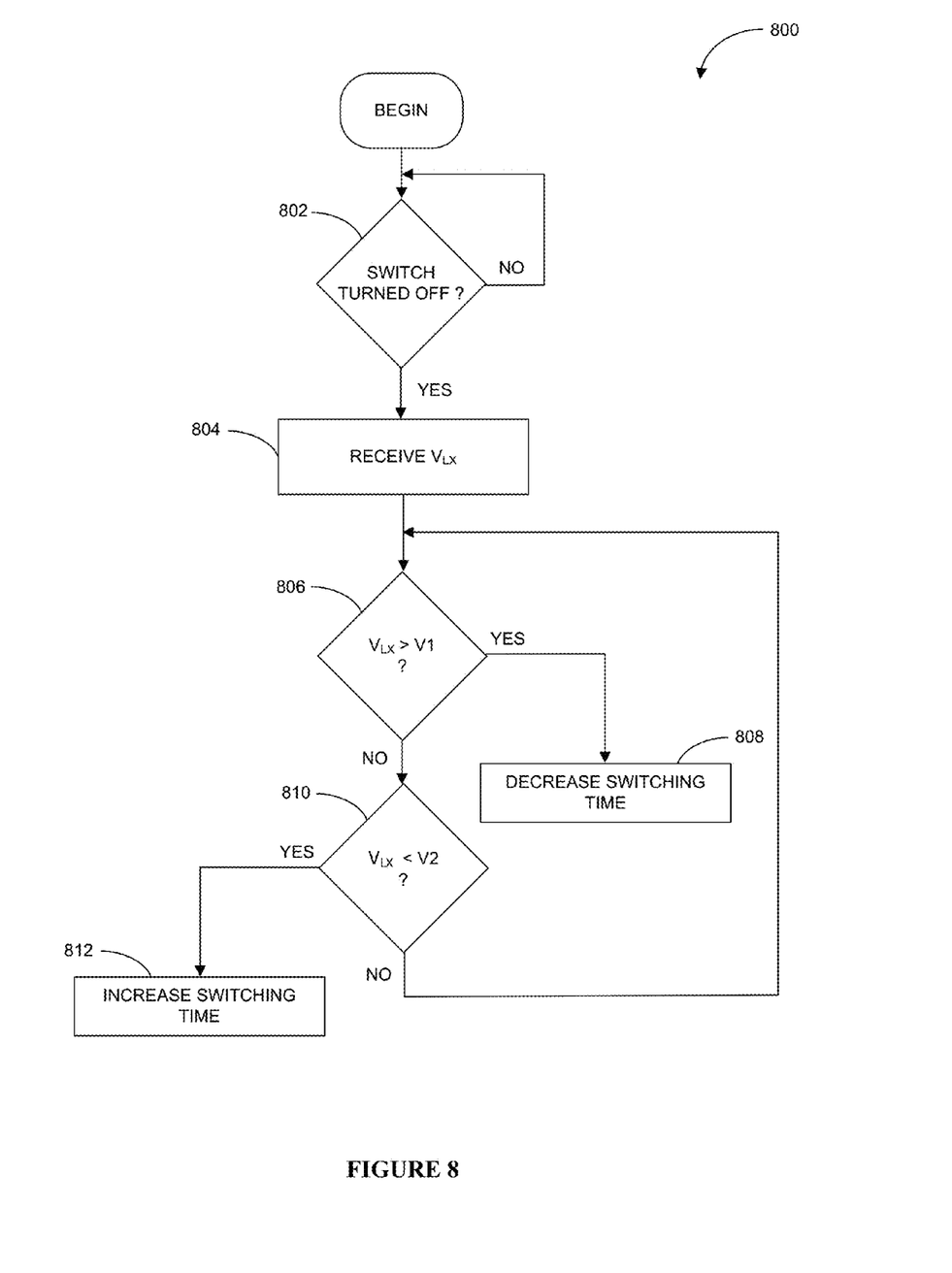
FIG. 8 is a flowchart of an illustrative process for adjusting a zero cross condition in a switching regulator in accordance with various embodiments of the invention.

FIG. 8 is a flowchart of an illustrative process for adjusting a zero cross condition in a switching regulator in accordance with various embodiments of the invention. The process to adjust a zero cross condition starts at step 802 when a switch within the switching regulator is turned off. The switch may be a semiconductor transistor device, such as an NMOS transistor.

At step 804, a switching node voltage is received, for example, by a sensing circuit.

If, at step 806, the switching node voltage is greater than a first predetermined threshold voltage, then at step 808, the switching time is decreased.

Otherwise, if, as shown at step 810, the switching node voltage is below a second predetermined threshold voltage, then at step 812, the switching time is increased.

It is noted that the first predetermined threshold may be equal to the second predetermined threshold, and that fewer or additional steps may be incorporated with the steps illustrated herein without departing from the scope of the invention. No particular order is implied by the arrangement of blocks within the flowchart or the description herein.

It will be appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

We claim:

1. An adaptive zero cross circuit comprising:
   a sensor configured to receive a node voltage signal in response to a switching event, the sensor detects a variation in the node voltage signal and, in response, generates a first control signal; and
   a zero cross delay module coupled to receive the first control signal and output a second control signal, the second control signal is configurable to reduce a delay time between the switching event and a second event by counting to a maximum delay time during a continuous conduction mode and, in response to exceeding the maximum delay time, adjusting a turn-off time of a synchronous rectifier.

2. The circuit according to claim 1, wherein the sensor comprises a direction information about the node voltage signal.

3. The circuit according to claim 1, wherein the variation comprises the node voltage exceeding a first predetermined threshold value.

4. The circuit according to claim 1, wherein the sensor comprises a comparator configured to detect the variation and output the first control signal.

5. The circuit according to claim 1, wherein the second control signal is a delay signal.

6. The circuit according to claim 1, wherein the zero cross delay module comprises a counter configured to shorten a time between the switching event and to the second event in a switching cycle following the switching event.

7. The circuit according to claim 6, wherein the counter adjusts the switching event by adjusting a turn-off time of an NMOS transistor within a cycle.

8. The circuit according to claim 1, wherein the second event comprises a crossing of a predetermined value by an inductor current.

9. The circuit according to claim 8, wherein the second control signal is configurable to vary a switching frequency in a manner that causes the crossing.

10. The circuit according to claim 1, further comprising a current sense circuit comprising a sense comparator, the zero cross delay module is configured to adjust one of an offset or a propagation delay of the sense comparator.

11. A current sensing system comprising:
- a switching network coupled to a switching node having a switching node voltage, the switching network generates a switching event;
- a storage element coupled between the switching node and an output node, the storage element is configured to deliver power to the output node;
- a zero cross circuit coupled to the switching network, the zero cross circuit detects a variation in a node voltage signal in response to the switching event and, during a continuous conduction mode, generates a control signal to adjust a delay time between the switching node voltage exceeding a first predetermined threshold value and the switching event to adjust a turn-off time of a synchronous rectifier; and
- a control logic coupled to receive a voltage from an output node of the switching network, the control logic controls the switching network in response to the output voltage and the control signal.

12. A method to adjust a zero cross condition, the method comprising:
- detecting, in a first cycle, a variation in a node voltage in response to a switching event;
- based on the variation, determining a time delay between the switching event and a second event; and
- based on the time delay, reducing, in a second cycle, the time delay by adjusting a switching time of the switching event, wherein adjusting comprises:
  - counting to a maximum delay time during a continuous conduction mode; and, in response to exceeding the maximum delay time, adjusting a turn-off time of a synchronous rectifier in subsequent cycles.

13. The method according to claim 12, wherein detecting the variation comprises determining whether a node voltage signal exceeds a first predetermined value.

14. The method according to claim 12, wherein adjusting a switching time comprises adjusting a counter to vary an off time of a switch within the second cycle.

15. The method according to claim 12, wherein the second event comprises a crossing of a predetermined value by an inductor current.

16. The method according to claim 12, wherein the switching event comprises turning off an NMOS device.

17. The method according to claim 12, further comprising sensing a current.

18. The method according to claim 17, further comprising determining how far the node voltage deviates from a second predetermined value.

19. The method according to claim 18, further comprising determining a local minimum in an inductor current based on a back body diode voltage.

* * * * *